(12) United States Patent
Hattori et al.

(10) Patent No.: US 9,082,549 B2
(45) Date of Patent: Jul. 14, 2015

(54) ELECTRONIC COMPONENT

(71) Applicant: Murata Manufacturing Co., Ltd., Nagaokakyo-shi, Kyoto-fu (JP)

(72) Inventors: Kazuo Hattori, Nagaokakyo (JP); Isamu Fujimoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 4 days.

(21) Appl. No.: 14/027,685

(22) Filed: Sep. 16, 2013

(65) Prior Publication Data
US 2014/0016242 A1 Jan. 16, 2014

Related U.S. Application Data

(63) Continuation of application No. PCT/JP2012/056826, filed on Mar. 16, 2012.

(30) Foreign Application Priority Data

Mar. 25, 2011 (JP) ................................. 2011-067181

(51) Int. Cl.
*H05K 7/00* (2006.01)
*H05K 1/11* (2006.01)
(Continued)

(52) U.S. Cl.
CPC . *H01G 4/01* (2013.01); *H01G 2/06* (2013.01); *H05K 1/181* (2013.01); *H05K 1/0271* (2013.01); *H05K 1/141* (2013.01); *H05K 3/3442* (2013.01);
(Continued)

(58) Field of Classification Search
CPC ........... H01G 2/06; H01G 4/01; H05K 1/181; H05K 1/0271; H05K 1/141; H05K 3/3442; H05K 2201/049; H05K 2201/09181; H05K 2201/10015; H05K 2201/2045; H05K 2201/041

USPC ........... 174/262–266; 361/760, 767, 768, 782
See application file for complete search history.

(56) References Cited

U.S. PATENT DOCUMENTS

| 2003/0117784 A1* | 6/2003 | Fukunabe et al. ............ 361/760 |
| 2004/0066589 A1* | 4/2004 | Togashi et al. .................. 361/15 |
| 2010/0123995 A1 | 5/2010 | Otsuka et al. |

FOREIGN PATENT DOCUMENTS

| JP | 07-212004 A | 8/1995 |
| JP | 8-55752 A | 2/1996 |

(Continued)

OTHER PUBLICATIONS

Official Communication issued in corresponding Japanese Patent Application No. 2012-173742, mailed on Aug. 6, 2013.
Official Communication issued in corresponding Japanese Patent Application No. 2012-173743, mailed on Aug. 6, 2013.
Official Communication issued in International Patent Application No. PCT/JP2012/056826, mailed on Jun. 19, 2012.
Official Communication issued in corresponding Japanese Patent Application No. 2012-173742, mailed on Nov. 5, 2013.

*Primary Examiner* — Hoa C Nguyen
(74) *Attorney, Agent, or Firm* — Keating & Bennett, LLP (57) ABSTRACT

A multilayer ceramic capacitor includes flat-shaped inner electrodes that are laminated. An interposer includes an insulating substrate that is larger than contours of the multilayer ceramic capacitor. A first mounting electrode that mounts the multilayer ceramic capacitor is located on a first principal surface of the insulating substrate, and a first external connection electrode for connection to an external circuit board located on a second principal surface. The multilayer ceramic capacitor is mounted onto the interposer in such a way that the principal surfaces of the inner electrodes are parallel or substantially parallel to the principal surface of the interposer, that is, the first and second principal surfaces of the insulating substrate.

15 Claims, 7 Drawing Sheets

(51) Int. Cl.
  *H05K 1/16* (2006.01)
  *H01G 4/01* (2006.01)
  *H01G 2/06* (2006.01)
  *H05K 1/18* (2006.01)
  *H05K 1/14* (2006.01)
  *H05K 3/34* (2006.01)
  *H05K 1/02* (2006.01)

(52) U.S. Cl.
  CPC .... *H05K 2201/041* (2013.01); *H05K 2201/049* (2013.01); *H05K 2201/09181* (2013.01); *H05K 2201/10015* (2013.01); *H05K 2201/2045* (2013.01)

(56) References Cited

FOREIGN PATENT DOCUMENTS

| | | |
|---|---|---|
| JP | 08-162357 A | 6/1996 |
| JP | 08-222831 A | 8/1996 |
| JP | 09-129478 A | 5/1997 |
| JP | 09-139324 A | 5/1997 |
| JP | 2002-025850 A | 1/2002 |
| JP | 2003-188041 A | 7/2003 |
| JP | 2004-134430 A | 4/2004 |
| JP | 2004-335657 A | 11/2004 |
| JP | 2006-186167 A | 7/2006 |
| JP | 2009-200421 A | 9/2009 |
| JP | 2010-123614 A | 6/2010 |

\* cited by examiner

ELECTRONIC COMPONENT

BACKGROUND OF THE INVENTION

1. Field of the Invention

The present invention relates to an electronic component including a multilayer ceramic capacitor, and an interposer that mounts the multilayer ceramic capacitor onto a circuit board.

2. Description of the Related Art

Currently, chip components, in particular, miniature multilayer ceramic capacitors are frequently used for mobile terminals such as cellular phones. A multilayer ceramic capacitor includes a rectangular component body that functions as a capacitor, and outer electrodes formed at opposite ends of the component body.

In the related art, generally, as disclosed in Japanese Unexamined Patent Application Publication No. 8-55752, a multilayer ceramic capacitor is electrically and physically connected to a circuit board by placing outer electrodes directly on the mounting land of the circuit board of a mobile terminal, and bonding the mounting land and the outer electrodes together with a bonding agent such as a solder.

However, a multilayer ceramic capacitor is subject to mechanical distortion in some cases due to variations in the voltage applied to the multilayer ceramic capacitor. When this distortion occurs, the distortion is transmitted to the circuit board, causing the circuit board to vibrate. When the circuit board vibrates, vibration sound audible to the human ears occurs in some cases.

As a solution to this problem, for example, Japanese Unexamined Patent Application Publication No. 2004-134430 and Japanese Unexamined Patent Application Publication No. 2010-123614 describe not mounting the multilayer ceramic capacitor directly on the mounting land. In Japanese Unexamined Patent Application Publication No. 2004-134430, an interposer formed by an insulating substrate is used. In a case where an interposer is used, the multilayer ceramic capacitor is bonded to upper electrodes of the interposer, and lower electrodes of the interposer are bonded to mounting electrodes of the circuit board. The electrical continuity between each of the upper and lower electrodes is provided by a via-hole that penetrates the interposer. In Japanese Unexamined Patent Application Publication No. 2010-123614, the outer electrodes of the multilayer ceramic capacitor are held from both side end portions and supported in midair by a conductive support member, and the bottom surface of the conductive support member is bonded to a circuit board mounting electrode.

However, Japanese Unexamined Patent Application Publication No. 2004-134430 adopts a special structure in which the arrangement direction of the lower electrodes and the arrangement direction of the upper electrodes in the interposer cross each other, that is, the arrangement direction of the outer electrodes of the multilayer ceramic capacitor and the arrangement direction of the mounting electrodes with respect to the circuit board of the interposer cross each other. Therefore, in a case where vibration sound occurs when the multilayer ceramic capacitor is directly mounted onto the circuit board, changes to the land pattern or the like are required in the configuration according to Japanese Unexamined Patent Application Publication No. 2004-134430. However, such an improvement based on changes to the land pattern is difficult to achieve for circuit boards currently in use which typically require high-density mounting. Moreover, miniaturization is not easy to achieve, with the possibility of further increasing cost.

According to the configuration described in Japanese Unexamined Patent Application Publication No. 2010-123614, the multilayer ceramic capacitor is supported in midair by the conductive support member, which makes it difficult to achieve a reduction in height. In addition, it is difficult to mount the multilayer ceramic capacitor with an appropriate spacing between the multilayer ceramic capacitor and the circuit board. Further, because a flat-shaped conductor is used for the conductive support member, it is difficult to ensure sufficient mounting strength.

SUMMARY OF THE INVENTION

Accordingly, preferred embodiments of the present invention provide an electronic component that allows easy structural design and mounting, has a mounting strength and electrical characteristics equivalent to those of mounting structures of the related art, and significantly reduces or prevents vibration sound.

A preferred embodiment of the present invention relates to an electronic component including a multilayer ceramic capacitor, and a substrate including an insulating principal flat plate. The multilayer ceramic capacitor includes a ceramic laminate that includes a plurality of ceramic layers and a plurality of inner electrodes which are alternately laminated, and a first outer electrode and a second outer electrode that are located at opposite ends of the ceramic laminate. The substrate preferably has a flat shape and includes a first principal surface and a second principal surface that are opposite to each other. The substrate includes a first mounting electrode and a second mounting electrode that are located on a first principal surface. The first outer electrode is mounted on the first mounting electrode. The second outer electrode is mounted on the second mounting electrode. The substrate includes a first external connection electrode and a second external connection electrode that are formed on the second principal surface. The first external connection electrode connects to the first mounting electrode. The second external connection electrode connects to the second mounting electrode. In the electronic component configured as described above, the multilayer ceramic capacitor is mounted in such a way that the inner electrodes are parallel or substantially parallel to the first principal surface and the second principal surface.

According to this configuration, by regulating the direction in which to mount the multilayer ceramic capacitor, as illustrated in FIGS. 1 to 4 described later, it is possible to prevent a bonding agent such as a solder from adhering to regions of the multilayer ceramic capacitor that are subject to large distortion due to variations in applied voltage. Because a flat-shaped substrate is used, and the multilayer ceramic capacitor is mounted onto this substrate, structural design and mounting are easy, and a mounting strength and electrical characteristics equivalent to those of mounting structures of the related art are achieved.

Further, the substrate of the electronic component according to a preferred embodiment of the present invention is preferably configured as described below. A first end portion and a second end portion, which are opposite ends of the longitudinal direction at which the first mounting electrode and the second mounting electrode are arranged, are spaced apart from a first device end surface at which the first outer electrode of the multilayer ceramic capacitor is located and a second device end surface at which the second outer electrode is located, respectively. A first connecting conductor that connects the first mounting electrode and the first outer electrode is located at the first end portion. A second connecting conductor that connects the second mounting electrode and the second outer electrode is located at the second end portion.

According to this configuration, the first connecting conductor and the second connecting conductor of the substrate along which the bonding agent climbs up and wets are spaced apart from the first outer electrode and the second outer electrode of the multilayer ceramic capacitor. Therefore, it is possible to significantly reduce or prevent climbing and wetting of the bonding agent onto the first outer electrode and the second outer electrode.

Further, the substrate of the electronic component according to a preferred embodiment of the present invention is preferably configured as described below. The distance between the first end portion and the second end portion is longer than the distance between the first device end surface and the second device end surface of the multilayer ceramic capacitor. The substrate includes a first recess and a second recess that are located at center or substantially center positions of the lateral direction of the first end portion and the second end portion perpendicular or substantially perpendicular to the longitudinal direction, respectively. The first recess and the second recess are recessed in a direction toward the center of the substrate from the opposite ends of the longitudinal direction, and at least partially enter under the bottom surface of the multilayer ceramic capacitor. The first connecting conductor is provided only in a side wall surface defining the first recess connecting to the first end portion. The second connecting conductor is provided only in a side wall surface defining the second recess connecting to the second end portion.

By providing such recesses, even if the substrate is larger than the multilayer ceramic capacitor, the first outer electrode and the second outer electrode of the multilayer ceramic capacitor, and the first connecting conductor and the second connecting conductor in the recesses at least partially overlap in plan view. Consequently, even if the electronic component mounting land formed on an external circuit board is arranged in substantially the same position and shape as the mounting land used to directly mount the multilayer ceramic capacitor, bonding using the bonding agent can be reliably performed. Further, in the case of such bonding, the bonding agent climbs up and wets from the first connecting conductor and the second connecting conductor that are located in the side wall surfaces defining the recesses of the substrate and having a circular or substantially circular arc shape in plan view. At this time, a portion of the bonding agent adheres to the bottom surfaces (mounting surfaces) of the first outer electrode and second outer electrode, before climbing and wetting onto the principal surfaces of the first outer electrode and second outer electrode (the opposite sides of the multilayer ceramic capacitor). Therefore, the amount of bonding agent that climbs and wets onto the principal surfaces of the first outer electrode and second outer electrode is significantly reduced as compared with a case where a substrate having the same contour area as the multilayer ceramic capacitor is simply used.

Further, the substrate of the electronic component according to a preferred embodiment of the present invention is preferably configured as described below. When viewed in a direction normal to the first principal surface and the second principal surface, the first connecting conductor is provided only in an area of the side wall surface defining the first recess which overlaps the multilayer ceramic capacitor. When viewed in the direction normal to the first principal surface and the second principal surface, the second connecting conductor is provided only in an area of the side wall surface defining the second recess which overlaps the multilayer ceramic capacitor.

According to this configuration, the amount of bonding agent that climbs and wets onto the first outer electrode and the second outer electrode is further reduced.

Further, the substrate of the electronic component according to a preferred embodiment of the present invention is preferably configured as described below. A first end portion and a second end portion, which are opposite ends of the longitudinal direction at which the first mounting electrode and the second mounting electrode are arranged, coincide with a first device end surface at which the first outer electrode of the multilayer ceramic capacitor is located and a second device end surface at which the second outer electrode is located, respectively. The substrate includes a first recess and a second recess that are located at center or substantially center positions of the lateral direction of the first end portion and the second end portion perpendicular or substantially perpendicular to the longitudinal direction, respectively. The first recess and the second recess are recessed in a direction toward the center of the substrate from the opposite ends of the longitudinal direction.

According to this configuration, opposite longitudinal ends of the multilayer ceramic capacitor and opposite longitudinal ends of the substrate coincide with each other. Therefore, the mounting area can be reduced. Further, the provision of the recesses makes it possible to reduce climbing and wetting of the bonding agent onto the first outer electrode and the second outer electrode.

Further, in the electronic component according to a preferred embodiment of the present invention, the height of a bonding agent that bonds with each of the first outer electrode and the second outer electrode is preferably less than or equal to about ¼ of the height of each of the first outer electrode and the second outer electrode from the mounting surface of the multilayer ceramic capacitor, for example.

Figure 4A:
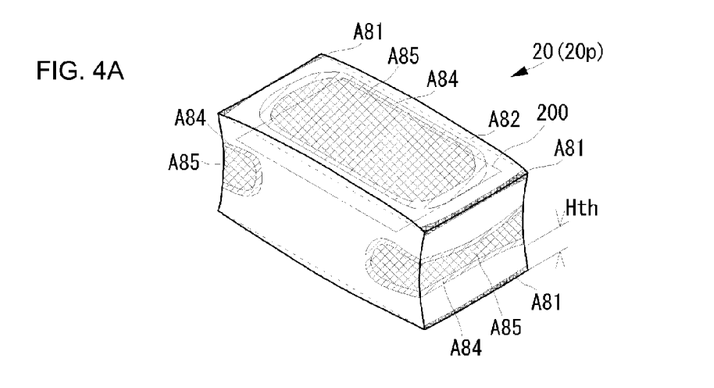
FIGS. 4A and 4B each illustrate the distribution of distortion of a multilayer ceramic capacitor due to voltage application.
Figure 4B:
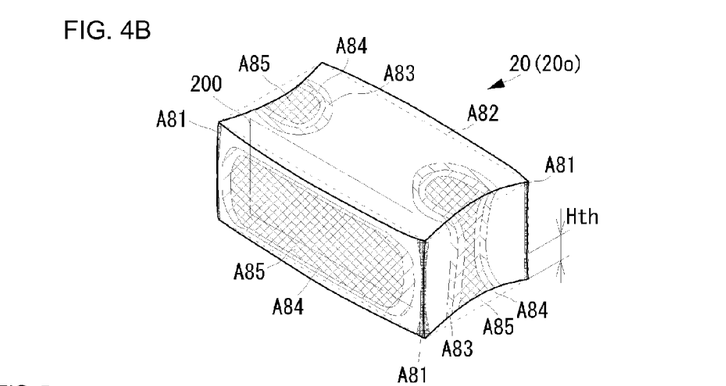

When the bonding agent is applied within this height range, it is possible to reduce adhesion of the bonding agent to regions that are subject to large distortion as illustrated in FIG. 4.

When the multilayer ceramic capacitor is mounted onto the circuit board by using the electronic component according to a preferred embodiment of the present invention, occurrence of vibration sound is significantly reduced or prevented. Further, the electronic component has a simple structure and allows miniaturization, and also allows easy mounting onto the circuit board. Moreover, it is possible to ensure a mounting strength and electrical characteristics equivalent to those of mounting structures used in the related art.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
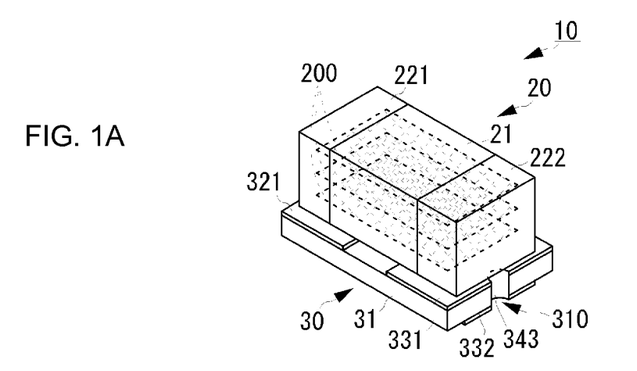
FIGS. 1A and 1B are perspective views respectively illustrating the outward appearance and mounting state of an electronic component 10 according to a first preferred embodiment of the present invention.
Figure 1B:
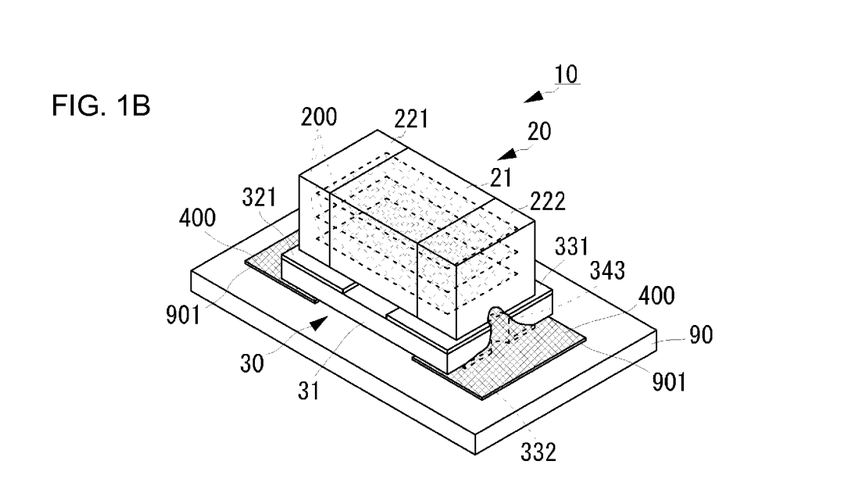
Figure 2A:
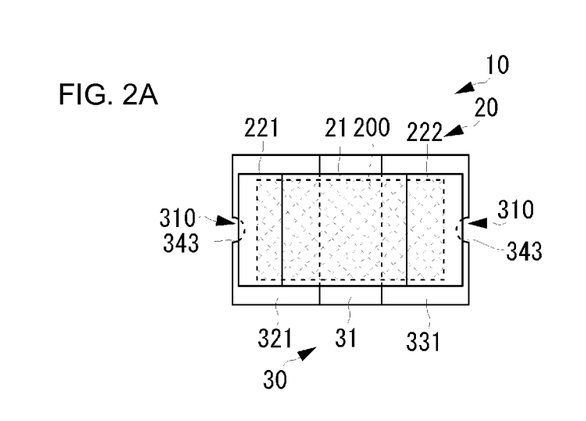
FIGS. 2A-2D are four-side views of the electronic component 10 according to the first preferred embodiment of the present invention.
Figure 2B:
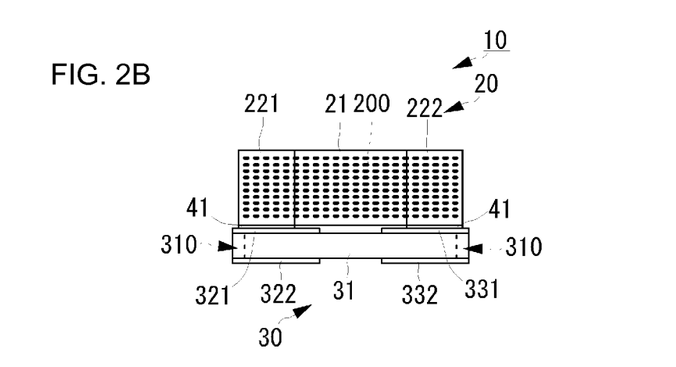
Figure 2C:
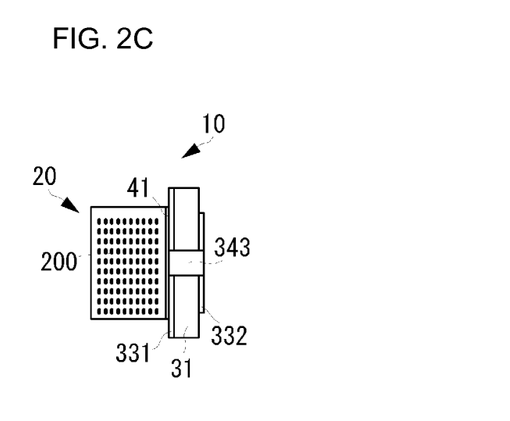
Figure 2D:
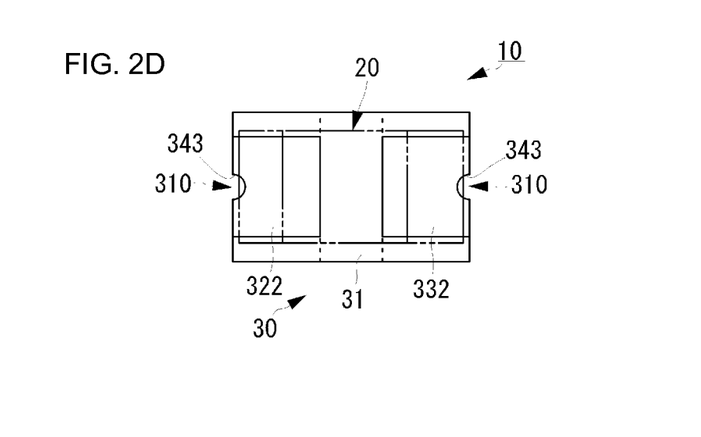
Figure 3A:
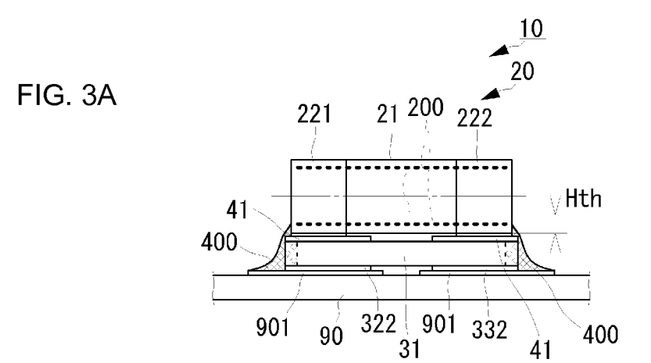
FIGS. 3A and 3B are a first side view and a second side view of the electronic component 10 according to the first preferred embodiment of the present invention.
Figure 3B:
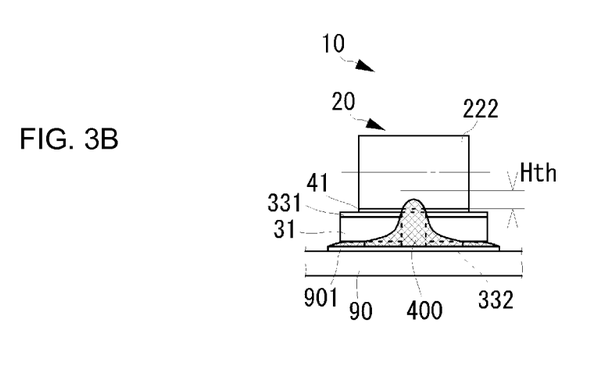

An electronic component according to a first preferred embodiment of the present invention will be described with reference to the drawings. FIG. 1A is a perspective view of the outward appearance of an electronic component 10 according to the first preferred embodiment. FIG. 1B is a perspective view of the mounting state of the electronic component 10. FIGS. 2A-2D are four-side views of the electronic component 10 according to the first preferred embodiment, of which FIG. 2A is a plan view, FIG. 2) is a first (longitudinal) side view, FIG. 2C is a second (lateral) side view, and FIG. 2D is a rear view. FIGS. 3A and 3B are a first side view and a second side view each illustrating the mounting state of the electronic component 10 according to the first preferred embodiment.

The electronic component 10 includes a multilayer ceramic capacitor 20 and an interposer 30. The interposer 30 corresponds to the "substrate" according to a preferred embodiment of the present invention.

The multilayer ceramic capacitor 20 includes a rectangular or substantially rectangular parallelepiped ceramic laminate 21. The ceramic laminate 21 includes a predetermined number of flat-shaped inner electrodes 200 that are laminated with dielectric layers therebetween. A first outer electrode 221 and a second outer electrode 222 are located at opposite longitudinal ends (corresponding to the first device end surface and the second device end surface according to a preferred embodiment of the present invention) of the ceramic laminate 21. The first outer electrode 221 and the second outer electrode 222 connect to different inner electrodes 200. The first outer electrode 221 and the second outer electrode 222 are located not only in opposite longitudinal end surfaces but extend over from the opposite longitudinal end surfaces to opposite lateral (direction perpendicular or substantially perpendicular to the longitudinal direction) end surfaces, the top surface, and the bottom surface. By taking corrosion resistance and electrical conductivity into consideration, predetermined metal plating is applied to the first outer electrode 221 and the second outer electrode 222.

The multilayer ceramic capacitor 20 formed in this way preferably has a length (longitudinal direction) by width (lateral direction) dimension of, for example, approximately 3.2 mm×1.6 mm, 2.0 mm×1.25 mm, 1.6 mm×0.8 mm, 1.0 mm×0.5 mm, 0.8 mm×0.4 mm, or 0.6 mm×0.3 mm.

The interposer 30 includes an insulating substrate 31. The insulating substrate 31 preferably is made of insulating resin with a thickness of about 0.5 mm to about 1.0 mm, for example. When viewed in a direction perpendicular to a first principal surface and a second principal surface that are flat-shaped surfaces, the insulating substrate 31 preferably has a rectangular or substantially rectangular shape similar to the multilayer ceramic capacitor 20.

When viewed in the direction perpendicular to the first principal surface and the second principal surface, the insulating substrate 31 is slightly larger than the multilayer ceramic capacitor 20 in both the longitudinal direction and the lateral direction. For example, the insulating substrate 31 has a size that extends off the length and width of the multilayer ceramic capacitor 20 by a predetermined ratio, or has a shape that extends off the outer periphery of the multilayer ceramic capacitor 20 by a predetermined length.

Recesses 310 are provided at opposite longitudinal ends (corresponding to the first end portion and the second end portion according to the present invention) of the insulating substrate 31, at the center or substantially the center position in the lateral direction. The recesses 310 penetrate the insulating substrate 31 in the thickness direction so as to define a circular or substantially circular arc with a predetermined diameter when viewed from the direction perpendicular or substantially perpendicular to the first principal surface and the second principal surface.

Each of the recesses 310 (corresponding to the first recess and the second recess according to a preferred embodiment of the present invention) has such a shape that the intermediate portion of its circular or substantially circular arc enters under the bottom surface of each of the first outer electrode 221 and the second outer electrode 222 of the multilayer ceramic capacitor 20. In other words, when viewed from the direction perpendicular to the first principal surface and the second principal surface, each of the recesses 310 is arranged so that the intermediate portion of its circular or substantially circular arc overlaps the multilayer ceramic capacitor 20. In still other words, the multilayer ceramic capacitor 20 is mounted in such a way that each of the first outer electrode 221 and the second outer electrode 222 at its opposite ends overlap the intermediate portion of the corresponding recess 310.

A first mounting electrode 321 and a second mounting electrode 331 are located on the first principal surface (front surface) of the insulating substrate 31. The first mounting electrode 321 and the second mounting electrode 331 are located at opposite longitudinal end portions of the insulating substrate 31. Each of the first mounting electrode 321 and the second mounting electrode 331 is arranged so as to extend to the position of a predetermined length from the longitudinal end portion toward the center of the longitudinal direction. Each of the first mounting electrode 321 and the second mounting electrode 331 is arranged over the entire length in the lateral direction of the insulating substrate 31. The shape of the first mounting electrode 321 and the second mounting electrode 331 may be set as appropriate in accordance with the shape of the outer electrodes of the multilayer ceramic capacitor 20. In this way, a so-called self-alignment effect can be obtained when mounting the multilayer ceramic capacitor 20 onto the interposer 30, allowing the multilayer ceramic capacitor 20 to be mounted at a desired position on the interposer 30. This effect ensures more reliably that the solder does not climb up and wet from an external circuit board 90.

A first external connection electrode 322 and a second external connection electrode 332 are located on the second principal surface (back surface) of the insulating substrate 31. The first external connection electrode 322 is located opposite to the first mounting electrode 321. The second external connection electrode 332 is located opposite to the second mounting electrode 322. The shape of the first external connection electrode 322 and the second external connection electrode 332 is such that the first external connection electrode 322 and the second external connection electrode 332 are not located in an area of a predetermined length from opposite ends along the lateral direction of the insulating substrate 31. The shape of the first external connection electrode 322 and the second external connection electrode 332 may be set as appropriate in accordance with the shape of a mounting land 901 of the external circuit board 90 onto which the electronic component 10 is mounted.

Connecting conductors 343 are provided in opposite side wall surfaces of the insulating substrate 31 which define the recesses 310 and have a circular or substantially circular arc shape in plan view. The connecting conductors 343 provide electrical continuity between the first mounting electrode 321 and the first external connection electrode 322, and electrical continuity between the second mounting electrode 331 and the second external connection electrode 332.

As illustrated in FIGS. 1 to 3, the multilayer ceramic capacitor 20 is mounted onto the interposer 30 having the above-mentioned structure in such a way that the flat-shaped surfaces of the inner electrodes 200 become parallel or substantially parallel to the first principal surface and the second principal surface of the interposer 30.

The first outer electrode 221 of the multilayer ceramic capacitor 20 is mounted on the first mounting electrode 321 of the interposer 30. The second outer electrode 222 of the multilayer ceramic capacitor 20 is mounted on the second mounting electrode 331 of the interposer 30. At this time, bonding of the first outer electrode 221 and the first mounting electrode 321, and bonding of the second outer electrode 222 and the second mounting electrode 331 are accomplished by re-melting of the metal plating (for example, tin plating) of the first outer electrode 221 and the second outer electrode 222, on the mounting surface side of the first outer electrode 221 and the second outer electrode 222. Consequently, a bonding layer 41 is provided between the first outer electrode 221 and the first mounting electrode 321 to provide electrical and mechanical connection, and between the second outer electrode 222 and the second mounting electrode 331 to provide electrical and mechanical connection. If metal plating is applied to the first mounting electrode 321 and the second mounting electrode 331 in advance in a manner similar to the outer electrodes, the metal plating of each of the first mounting electrode 321 and the second mounting electrode 331 is also connected at this time. The bonding of the multilayer ceramic capacitor 20 and the interposer 30 may be performed by a bonding agent (for example, a solder), without using the metal plating of the first and second outer electrodes 221 and 222 or the metal plating of the interposer 30.

The electronic component 10 formed in this way is mounted onto the external circuit board 90 as illustrated in FIGS. 1B, 3A and 3B. At this time, the electronic component 10 is mounted in such a way that each of the first external connection electrode 322 and the second external connection electrode 332 connects to the corresponding mounting land 901 of the external circuit board 90. A bonding agent (for example, a solder) 400 is preferably used for the connection between each of the first external connection electrode 322 and the second external connection electrode 332 and the corresponding mounting land 901.

This bonding using the bonding agent 400 is performed in such a way that a fillet is formed at least in an area from the mounting land 901 of the external circuit board 90 to the connecting conductors 343 in the recesses 310 of the interposer 30. Forming a fillet in this way provides such advantages as preventing lifting of the electronic component 10 when mounting, ensuring bond strength, and enables a visual check for bond failures, and thus proves very advantageous.

Although a solder is preferred as the bonding agent 400, any material other than a solder may be used as a bonding agent as long as the material has appropriate wettability and electrical conductivity.

Performing bonding by using the bonding agent 400 in this way presents the following problem. That is, in a case where a large amount of bonding agent has been supplied, it is conceivable that excess bonding agent 400, more than necessary for forming a fillet at the connecting conductors 343 in the recesses 310, climbs onto the upper surface side of the interposer 30 via the connecting conductors 343.

However, according to this preferred embodiment, opposite ends of the interposer 30 are spaced apart from opposite ends of the multilayer ceramic capacitor 20. Accordingly, even if the bonding agent 400 climbs and wets onto the upper surface side of the interposer 30, the bonding agent 400 is unlikely to reach the first and second outer electrodes 221 and 222. Therefore, the amount of the bonding agent 400 that climbs and wets onto the principal surfaces of the first and second outer electrodes 221 and 222 (opposite longitudinal end surfaces of the multilayer ceramic capacitor 20) can be reduced.

Further, the recesses 310 that enter under the bottom surface side of the multilayer ceramic capacitor 20 are provided, and the connecting conductors 343 are provided only in the recesses 310. Accordingly, as the bonding agent 400 climbs and wets onto the principal surface of the interposer 30, the bonding agent 400 goes through the bottom surface of the multilayer ceramic capacitor 20, so as to further reduce the amount of the bonding agent 400 that climbs and wets onto the principal surfaces of the first and second outer electrodes 221 and 222.

Therefore, by employing the configuration according to this preferred embodiment, if the amount of the bonding agent 400 is just enough to directly mount the multilayer ceramic capacitor 20 onto the mounting land 901 of the external circuit board 90, the amount of the bonding agent 400 that climbs up and wets can be limited to, for example, about ¼ to about ⅓ of the height from the mounting surface on the principal surface of each of the first and second outer electrodes 221 and 222 of the multilayer ceramic capacitor 20.

In this regard, it is known that the multilayer ceramic capacitor 20 undergoes distortion with applied voltage. However, it has been unknown until now how the multilayer ceramic capacitor 20 is distorted with voltage application. Accordingly, the present inventors analyzed the distortion of the multilayer ceramic capacitor 20 caused by voltage application, and obtained the following results.

FIGS. 4A and 4B each illustrate the distribution of distortion of the multilayer ceramic capacitor 20 due to voltage application. FIG. 4A illustrates simulated distortion in a case where the multilayer ceramic capacitor 20 is mounted in such a way that the principal surfaces of the inner electrodes 200 and interposer 30 become parallel or substantially parallel to each other as in this preferred embodiment. FIG. 4B illustrates simulated distortion in a case where the multilayer ceramic capacitor 20 is mounted in such a way that the principal surfaces of the inner electrodes 200 and interposer 30 become perpendicular or substantially perpendicular to each other.

In FIG. 4, A81, A82, A83, A84, and A85 are regions classified according to the amount of distortion. The relative amounts of distortion in these regions are as follows: A81<A82<A83<A84<A85. That is, A81 is the region that is least prone to distortion, and A85 is the region that is most prone to distortion.

In a case where the multilayer ceramic capacitor 20 is mounted in such a way that the principal surfaces of the inner electrodes 200 and interposer 30 become parallel or substantially parallel to each other, as illustrated in FIG. 4A, the entirety of the top surface and the bottom surface (not illustrated) of the multilayer ceramic capacitor 20 (20p) undergoes distortion, with the distortion becoming greater with increasing proximity to the center region. The distortion is smallest at either end edge in the longitudinal direction of the top surface and the bottom surface, where hardly any distortion occurs. The distortion is also great in the center region of the height direction at either longitudinal end of the multilayer ceramic capacitor 20 (20p).

In a case where the multilayer ceramic capacitor 20 (20o) is mounted in such a way that the principal surfaces of the inner electrodes 200 and interposer 30 become orthogonal to each other, as illustrated in FIG. 4B, the entirety of either side surface along the length of the multilayer ceramic capacitor 20 undergoes distortion, with the distortion becoming greater with increasing proximity to the center region. The distortion is smallest at either longitudinal end edge (the edge along the height direction) of either side surface along the length of the multilayer ceramic capacitor 20, where hardly any distortion occurs. The distortion is also great in the center region of the lateral direction at either longitudinal end surface of the multilayer ceramic capacitor 20 (20o).

On the basis of the above results, according to this preferred embodiment, as described above, the multilayer ceramic capacitor 20 is mounted in such a way that the principal surfaces of the inner electrodes 200 and interposer 30 become parallel or substantially parallel to each other. In addition, the interposer 30 preferably has a shape so as to limit the amount of the bonding agent 400 that climbs and wets onto the first and second outer electrodes 221 and 222. Consequently, even when distortion occurs in the multilayer ceramic capacitor 20 with voltage application, hardly any distortion occurs in the bonding portion of the multilayer ceramic capacitor 20 with the interposer 30. Therefore, hardly any vibration due to distortion occurs in the interposer 30 and the external circuit board 90, thus significantly reducing or preventing vibration sound described above with reference to the related art.

On the contrary, when the multilayer ceramic capacitor 20 is mounted in such a way that the principal surfaces of the inner electrodes 200 and interposer 30 become perpendicular or substantially perpendicular to each other as illustrated in FIG. 4B, the bonding agent climbs and wets onto regions that are subject to large distortion, which makes it impossible to reduce vibration sound.

Figure 5:
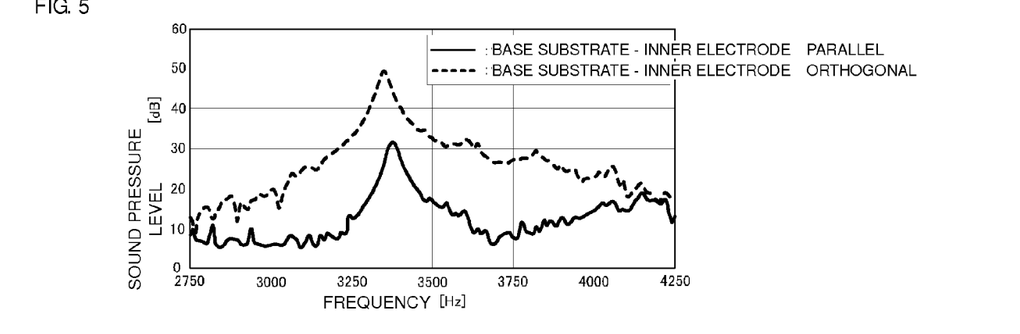
FIG. 5 illustrates the vibration sound reducing effect of the electronic component 10 according to the first preferred embodiment of the present invention.
Figure 6A:
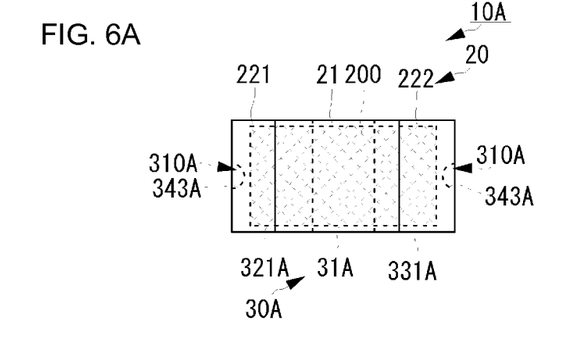
FIGS. 6A-6D are four-side views of an electronic component 10A according to a second preferred embodiment of the present invention.
Figure 6B:
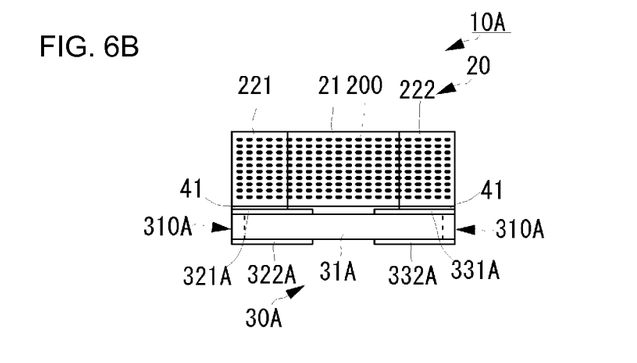
Figure 6C:
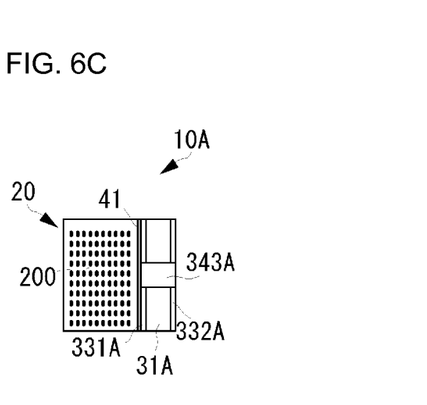
Figure 6D:
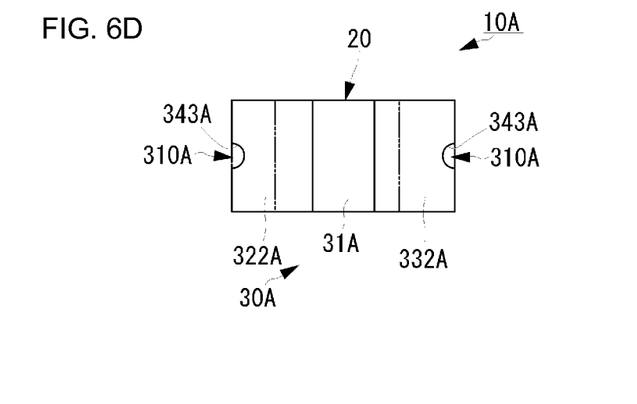

FIG. 5 illustrates the vibration sound reducing effect of the electronic component 10 according to this preferred embodiment. In FIG. 5, the solid line represents the frequency characteristic of the sound pressure level of vibration sound in a case where the configuration according to this preferred embodiment is used, and the broken line represents the frequency characteristic of the sound pressure level of vibration sound in a case where the configuration illustrated in FIG. 4B is used (in a case where the multilayer ceramic capacitor is mounted in such a way that the principal surfaces of the inner electrodes and interposer of the multilayer ceramic capacitor become perpendicular or substantially perpendicular to each other).

As illustrated in FIG. 5, by using the configuration according to this preferred embodiment, vibration sound can be significantly reduced or prevented over a wide range of frequencies. Further, the peak value of the sound pressure level can be reduced by about 20 dB, for example.

Next, an electronic component according to a second preferred embodiment will be described with reference to the drawings. FIGS. 6A-6D are four-side views of an electronic component 10A according to the second preferred embodiment.

The electronic component 10A according to this preferred embodiment is the same as the electronic component 10 according to the first preferred embodiment in the structure and mounting direction of the multilayer ceramic capacitor 20, and differs from the electronic component 10 in the shape of an interposer 30A. Accordingly, only differences will be described.

The interposer 30A includes an insulating substrate 31A. The contours of the insulating substrate 31A in plan view are preferably the same as those of the multilayer ceramic capacitor 20.

As in the first preferred embodiment, recesses 310A are located at opposite longitudinal ends of the insulating substrate 31A. The recesses 310A penetrate the insulating substrate 31A in the thickness direction. According to this configuration, each of the recesses 310A has such a shape that the entirety of its circular or substantially circular arc enters under the bottom surface of each of the first outer electrode 221 and second outer electrode 222 of the multilayer ceramic capacitor 20. In other words, when viewed from the direction perpendicular or substantially perpendicular to the first principal surface and the second principal surface, the recesses 310 overlap the multilayer ceramic capacitor 20.

A first mounting electrode 321A and a second mounting electrode 331A are provided on the first principal surface (front surface) of the insulating substrate 31A. The first mounting electrode 321A and the second mounting electrode 331A are located at opposite longitudinal end portions of the insulating substrate 31A. Each of the first mounting electrode 321A and the second mounting electrode 331A is arranged so as to extend to the position of a predetermined length from the longitudinal end portion toward the center of the longitudinal direction. Each of the first mounting electrode 321A and the second mounting electrode 331A is arranged over the entire length in the lateral direction of the insulating substrate 31A.

A first external connection electrode 322A and a second external connection electrode 332A are located on the second principal surface (back surface) of the insulating substrate 31A. The first external connection electrode 322A is located opposite to the first mounting electrode 321A. The second external connection electrode 332A is located opposite to the second mounting electrode 322A.

Connecting conductors 343A are provided in the side wall surfaces of the insulating substrate 31A which define the recesses 310A and have a circular or substantially circular arc shape in plan view. The connecting conductors 343A provide electrical continuity between the first mounting electrode 321A and the first external connection electrode 322A, and electrical continuity between the second mounting electrode 331A and the second external connection electrode 332A.

As illustrated in FIG. 6, the multilayer ceramic capacitor 20 is mounted onto the interposer 30A having the above-mentioned structure in such a way that the flat-shaped surfaces of the inner electrodes 200 are parallel or substantially parallel to the first principal surface and the second principal surface of the interposer 30A, and that the shapes of the contours of these principal surfaces substantially coincide with each other.

According to this configuration as well, the above-mentioned vibration sound reducing or preventing effect is obtained. In this preferred embodiment, while opposite ends of the interposer 30A and opposite ends of the multilayer ceramic capacitor 20 preferably coincide with each other in plan view, the entirety of the recesses 310A enters under the bottom surface of the multilayer ceramic capacitor 20, and each of the connecting conductors 343A is provided only in the side wall surface forming a circular or substantially circular arc that defines each of the recesses 310A. Accordingly, the bonding agent climbs and wets onto the principal surfaces of the first and second outer electrodes 221 and 222 via the connecting conductors 343A and the bottom surfaces of the first and second outer electrodes 221 and 222. Therefore, hardly any bonding agent directly climbs and wets onto the first and second outer electrodes 221 and 222 of the multilayer ceramic capacitor 20 from the mounting land 901 of the external circuit board 90. Consequently, as described above, it is possible to prevent the bonding agent from climbing and wetting high up to the principal surfaces of the first and second outer electrodes 221 and 222.

By using the configuration according to this preferred embodiment, the area in plan view becomes the same as that of the multilayer ceramic capacitor 20 alone. Thus, use of the interposer 30A does not cause an increase in mounting area. Therefore, the electronic component 10A having the multilayer ceramic capacitor 20 provided with the interposer 30A can be mounted with the minimum required mounting area.

Figure 7A:
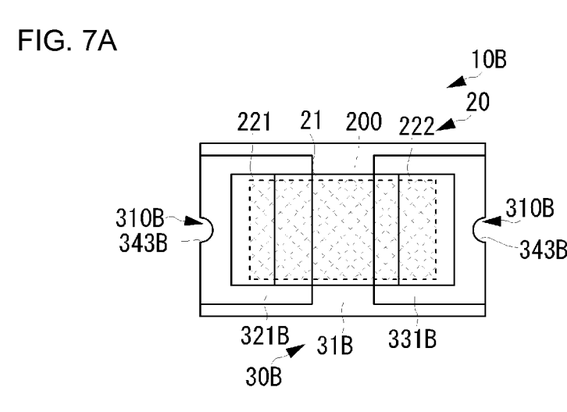
FIGS. 7A-7C are three-side views of an electronic component 10B according to a third preferred embodiment of the present invention.
Figure 7B:
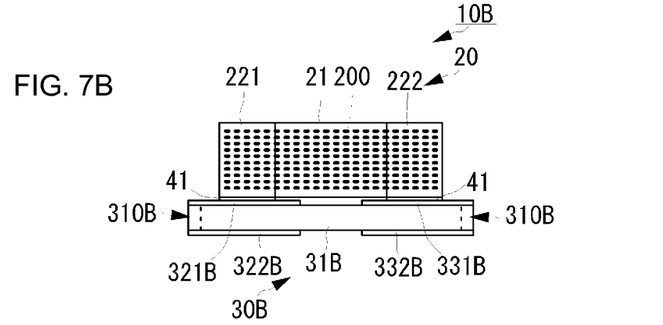
Figure 7C:
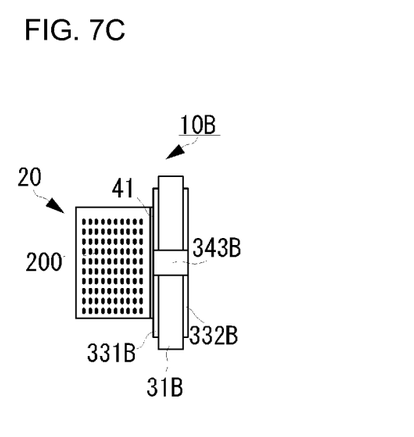

Next, an electronic component according to a third preferred embodiment will be described with reference to the drawings. FIGS. 7A-7C are three-side views of an electronic component 10B according to the third preferred embodiment.

The electronic component 10B according to this preferred embodiment is preferably the same as the electronic component 10 according to the first preferred embodiment in the structure and mounting direction of the multilayer ceramic capacitor 20, and differs from the electronic component 10 in the shape of an interposer 30B. Accordingly, only differences will be described.

The interposer 30B includes an insulating substrate 31B. The insulating substrate 31B has an area larger than that of the insulating substrate 31 according to the first preferred embodiment.

As in the first preferred embodiment, recesses 310B are located at opposite longitudinal ends of the insulating substrate 31B. The recesses 310B penetrate the insulating substrate 31B in the thickness direction.

A first mounting electrode 321B and a second mounting electrode 331B are located on the first principal surface (front surface) of the insulating substrate 31B. The first mounting electrode 321B and the second mounting electrode 331B are located at opposite longitudinal end portions of the insulating substrate 31B. Each of the first mounting electrode 321B and the second mounting electrode 331B is arranged so as to extend to the position of a predetermined length from the longitudinal end portion toward the center of the longitudinal direction. Each of the first mounting electrode 321B and the second mounting electrode 331B is arranged over the entire length in the lateral direction of the insulating substrate 31B.

A first external connection electrode 322B and a second external connection electrode 332B are located on the second principal surface (back surface) of the insulating substrate 31B. The first external connection electrode 322B is located opposite to the first mounting electrode 321B. The second external connection electrode 332B is located opposite to the second mounting electrode 322B. As in the first preferred embodiment, the shape of the first external connection electrode 322B and the second external connection electrode 332B may be set as appropriate in accordance with the shape of the mounting land 901 of the external circuit board 90.

Connecting conductors 343B are provided in the side wall surfaces of the insulating substrate 31B which define the recesses 310B and have a circular arc shape in plan view. The connecting conductors 343B provide electrical continuity between the first mounting electrode 321B and the first external connection electrode 322B, and electrical continuity between the second mounting electrode 331B and the second external connection electrode 332B. The recesses 310B may be omitted. In this case, the connecting conductors 343B may be provided as appropriate at either longitudinal end of the insulating substrate 31B.

According to this configuration as well, opposite ends of the interposer 30B and opposite ends of the multilayer ceramic capacitor 20 are spaced apart from each other by a large distance. Therefore, a vibration sound reducing or preventing effect is obtained in the same manner as in the above-mentioned preferred embodiments.

Figure 8A:
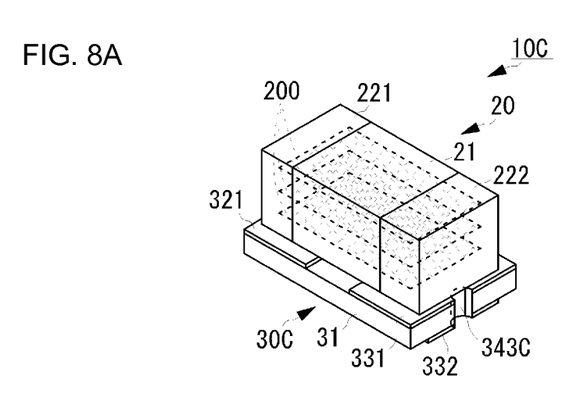
FIGS. 8A and 8B are a perspective view and a side view of an electronic component 10C according to a fourth preferred embodiment of the present invention.
Figure 8B:
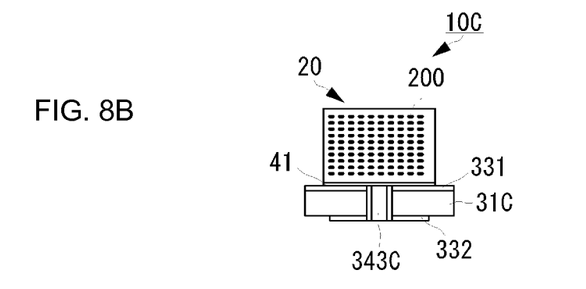

Next, an electronic component according to a fourth preferred embodiment will be described with reference to the drawings. FIG. 8A is a perspective view of an electronic component 10C according to the fourth preferred embodiment. FIG. 8B is a side view of a longitudinal end surface of the electronic component 10C.

The electronic component 10C according to this preferred embodiment is preferably the same as the electronic component 10 according to the first preferred embodiment in the structure and mounting direction of the multilayer ceramic capacitor 20, and differs from the electronic component 10 in the shape of connecting conductors 343C of an interposer 30C. Accordingly, only differences will be described.

Each of the connecting conductors 343C is provided only in an area of the circular or substantially circular arc-shaped side wall surface defining each of the recesses 310 which overlaps the multilayer ceramic capacitor 20 in plan view. According to this configuration, no connecting conductor that extends in the thickness direction along which the bonding agent 400 mainly climbs up and wets exists in the region of the recesses 310 lying outside the contours of the multilayer ceramic capacitor 20. Consequently, it is possible to reduce climbing and wetting of the bonding agent 400 onto the first and second outer electrodes 221 and 222 of the multilayer ceramic capacitor 20 more effectively.

While the above-mentioned preferred embodiments do not set a clear threshold as to the height to which the bonding agent 400 climbs up and wets, by taking the distortion distribution illustrated in FIGS. 4A and 4B into consideration, a height threshold Hth as illustrated in FIGS. 3A and 3B are set, and the interposer may be designed to such a shape that can reduce climbing and wetting of the bonding agent 400 so that the threshold Hth is not exceeded. As can be appreciated from FIGS. 4A and 4B, for example, the threshold Hth is preferably about ¼ to about ⅓ of the height of the multilayer ceramic capacitor 20 where the amount of distortion is relatively small.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An electronic component comprising:
 a multilayer ceramic capacitor including:
  a ceramic laminate including a plurality of ceramic layers and a plurality of inner electrodes which are alternately laminated; and a first outer electrode and a second outer electrode that are located at opposite ends of the ceramic laminate;

a substrate that has a flat shape and includes a first principal surface and a second principal surface that are opposite to each other, the substrate including:
- a first mounting electrode on which the first outer electrode is mounted;
- a second mounting electrode on which the second outer electrode is mounted;
- a first external connection electrode that connects to the first mounting electrode; and
- a second external connection electrode that connects to the second mounting electrode; wherein
- the first mounting electrode and the second mounting electrode are located on the first principal surface;
- the first external connection electrode and the second external connection electrode are located on the second principal surface;

the multilayer ceramic capacitor is mounted so that the first principal surface and the second principal surface, and the inner electrodes are parallel or substantially parallel to each other; and the first outer electrode includes a portion that does not overlap the substrate.

2. The electronic component according to claim 1, wherein in the substrate:
- a first end portion and a second end portion are spaced apart from a first device end surface at which the first outer electrode of the multilayer ceramic capacitor is located and a second device end surface at which the second outer electrode is located, respectively, the first end portion and the second end portion being opposite ends of a longitudinal direction at which the first mounting electrode and the second mounting electrode are arranged;
- a first connecting conductor is located at the first end portion, the first connecting conductor connecting the first mounting electrode and the first external connection electrode; and
- a second connecting conductor is located at the second end portion, the second connecting conductor connecting the second mounting electrode and the second external connection electrode.

3. The electronic component according to claim 2, wherein in the substrate:
- a distance between the first end portion and the second end portion is longer than a distance between the first device end surface and the second device end surface of the multilayer ceramic capacitor;
- a first recess and a second recess are provided at center or substantially center positions of a lateral direction of the first end portion and the second end portion perpendicular or substantially perpendicular to the longitudinal direction, respectively, the first recess and the second recess being recessed in a direction toward a center of the substrate from the opposite ends of the longitudinal direction and at least partially entering under a bottom surface of the multilayer ceramic capacitor;
- the first connecting conductor is provided only in a side wall surface defining the first recess connecting to the first end portion; and
- the second connecting conductor is provided only in a side wall surface defining the second recess connecting to the second end portion.

4. The electronic component according to claim 3, wherein in the substrate:
when viewed in a direction normal to the first principal surface and the second principal surface, the first connecting conductor is provided only in an area of the side wall surface defining the first recess which overlaps the multilayer ceramic capacitor; and when viewed in the direction normal to the first principal surface and the second principal surface, the second connecting conductor is provided only in an area of the side wall surface defining the second recess which overlaps the multilayer ceramic capacitor.

5. The electronic component according to claim 3, wherein each of the first and second recesses has a circular or substantially circular arc shape.

6. The electronic component according to claim 5, wherein each of the first and second recesses is arranged so that an intermediate portion of its circular or substantially circular arc shape overlaps the multilayer ceramic capacitor.

7. The electronic component according to claim 6, wherein each of the connecting conductors is provided only in an area of the circular or substantially circular arc-shaped side wall surface defining each of the recesses which overlaps the multilayer ceramic capacitor in plan view.

8. The electronic component according to claim 1, wherein in the substrate:
- a first end portion and a second end portion coincide with a first device end surface at which the first outer electrode of the multilayer ceramic capacitor is located and a second device end surface at which the second outer electrode is located, respectively, the first end portion and the second end portion being opposite ends of a longitudinal direction at which the first mounting electrode and the second mounting electrode are arranged; and
- a first recess and a second recess are provided at center or substantially center positions of a lateral direction of the first end portion and the second end portion perpendicular or substantially perpendicular to the longitudinal direction, the first recess and the second recess being recessed in a direction toward a center of the substrate from the opposite ends of the longitudinal direction.

9. The electronic component according to claim 1, wherein a height of a bonding agent that bonds with each of the first outer electrode and the second outer electrode is less than or equal to about 1/4 of a height of each of the first outer electrode and the second outer electrode from a mounting surface of the multilayer ceramic capacitor.

10. The electronic component according to claim 1, wherein the substrate is an interposer that has an outer dimension that is larger than that of the multilayer chip capacitor.

11. The electronic component according to claim 1, wherein the first outer electrode and the second outer electrode are located on opposite longitudinal end surfaces, extend over from the opposite longitudinal end surfaces to opposite lateral end surfaces, a top surface, and a bottom surface of the ceramic laminate.

12. The electronic component according to claim 1, wherein each of the multilayer ceramic capacitor and the substrate has a rectangular or substantially rectangular shape.

13. The electronic component according to claim 1, further comprising recesses located at opposite longitudinal ends of the substrate and arranged to penetrate the substrate in a thickness direction.

14. The electronic component according to claim 13, wherein each of the recesses has such a shape that an entirety of its circular or substantially circular arc enters under a bottom surface of each of the first outer electrode and the second outer electrode of the multilayer ceramic capacitor, such that when viewed from a direction perpendicular or substantially perpendicular to the first principal surface and the second principal surface, the recesses overlap the multilayer ceramic capacitor.

15. The electronic component according to claim 14, further comprising connecting conductors are provided in side wall surfaces of the substrate which define the recesses and have a circular or substantially circular arc shape in plan view.

* * * * *